(12) United States Patent
Yamada et al.

(10) Patent No.: US 6,449,763 B1
(45) Date of Patent: Sep. 10, 2002

(54) HIGH-LEVEL SYNTHESIS APPARATUS, HIGH LEVEL SYNTHESIS METHOD, AND RECORDING MEDIUM CARRYING A PROGRAM FOR IMPLEMENTING THE SAME

(75) Inventors: Akihisa Yamada, Nara-ken; Koichi Nishida, Tenri, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/547,796

(22) Filed: Apr. 12, 2000

(30) Foreign Application Priority Data

Jul. 29, 1999 (JP) .......................................... 11-216016

(51) Int. Cl.7 .............................................. G06F 17/50
(52) U.S. Cl. ...................................................... 716/18
(58) Field of Search ........................ 375/372; 430/567; 709/213; 712/1; 716/1–21

(56) References Cited

U.S. PATENT DOCUMENTS 6,021,266 A * 2/2000 Kay ............................... 716/2

FOREIGN PATENT DOCUMENTS

JP 09081605 3/1997
JP 10116302 5/1998

OTHER PUBLICATIONS

"Force–Directed Heuristic Method", Daniel D. Gajski, et al., *High–level Synthesis—Introduction to Chip and System Design*, (1992).
Page et al., Compiling Occam Into Field–Programmable Gate Arrays, 13 pages.

* cited by examiner

*Primary Examiner*—Matthew Smith
*Assistant Examiner*—Naum Levin

(57) ABSTRACT

A high-level synthesis apparatus for receiving operational descriptions includes synchronous communication instructions between threads which operate in parallel, and for synthesizing a product circuit based on the received operational descriptions. The high-level synthesis apparatus includes: an extractor for analyzing the received operational descriptions and extracting consecutive synchronous communication instructions which are of the same kind from among the received operational descriptions; a scheduler for generating scheduling for each thread by bundling together the extracted synchronous communication instructions into one arithmetic operation; and a circuit generator for generating the product circuit based on results of the scheduling, the product circuit being capable of commencing the bundled synchronous communication instructions with the same level of priority based on handshaking.

4 Claims, 13 Drawing Sheets

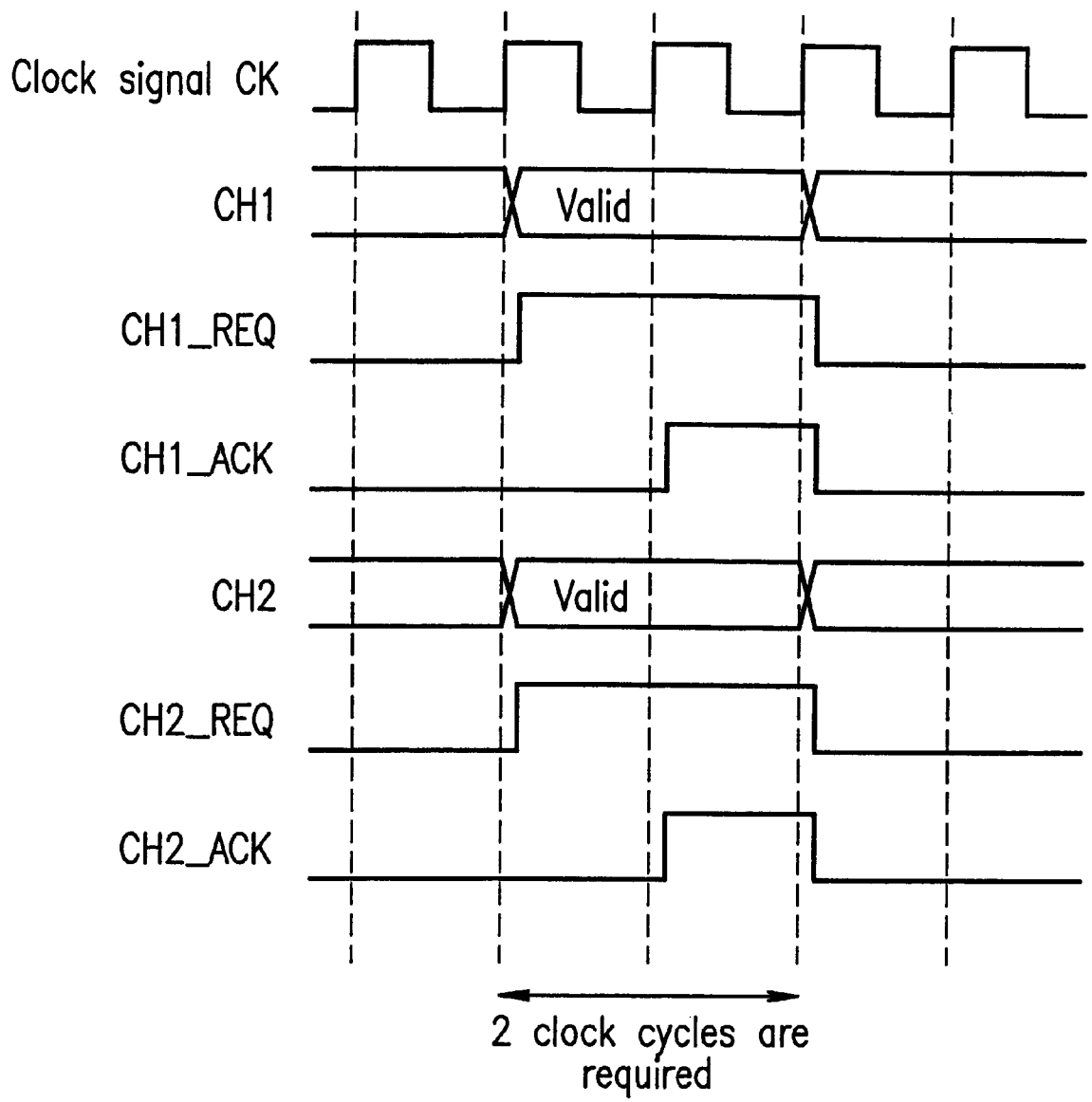

HIGH-LEVEL SYNTHESIS APPARATUS, HIGH LEVEL SYNTHESIS METHOD, AND RECORDING MEDIUM CARRYING A PROGRAM FOR IMPLEMENTING THE SAME

BACKGROUND OF THE INVENTION

1. Field of the Invention

The present invention relates to a high-level synthesis apparatus and method for use in the designing of logical circuits in an LSI, the apparatus and method being used for synthesizing circuits whose operations are expressed by operational descriptions (e.g., instructions, functions, procedures); and a recording medium carrying a program for implementing the high-level synthesis method.

2. Description of the Related Art

Conventionally, methods for synthesizing a circuit from operational descriptions which express operations of threads that operate in parallel and which express synchronous data communication between such threads are disclosed, for example, in Japanese Laid-Open Publication No. 10-116302, which has been filed by the Applicant.

The aforementioned conventional method is illustrated in FIG. 1. First, operational descriptions 1 are read, and the order of executing the arithmetic operations included therein is determined by a scheduler 3. Then, a circuit element allocator 5 allocates arithmetic operations and the like to elements (e.g., arithmetic logic units, registers, etc.) in the data path. Then, a control circuit is generated which generates signals controlling the data path such that it executes the arithmetic operations and the like in the order determined by the scheduler 3. Thus, a product circuit 7 is synthesized by this conventional synthesis method.

According to this conventional synthesis method, instructions (e.g., "send", "receive") are provided in an input language for defining a communication procedure (commonly known as a "protocol") such that data between two threads are transferred in a synchronous manner, i.e., a data transfer between a data-transmitting end and a data-receiving end can begin only after both ends become ready to commence data transfer. Thus, an instruction for sending data ("send") and an instruction for receiving data ("receive") are simply described in the input language. A product circuit is synthesized by additionally generating handshaking circuits for the respective threads for achieving handshaking there between. Thus, the product circuit guarantees synchronous communication between the threads.

However, a circuit which is generated by the aforementioned conventional synthesis method has a problem in that the communication slows down when a series of consecutive communication instructions are executed because such communication instructions are executed in a sequential manner.

For example, consider the two "SEND" instructions in a thread 15 included in a set of operational descriptions shown in FIG. 2. In this case, a circuit which is synthesized by the aforementioned conventional synthesis method can execute the communication described as SEND (CH2, D2) only after the communication described as SEND (CH1, D1) occurs. As a result, when handshaking communication is performed in synchronization with a clock signal, the execution of these two "SEND instructions" requires four clock cycles, as shown in FIG. 3.

SUMMARY OF THE INVENTION

According to the present invention, there is provided a high-level synthesis apparatus for receiving operational descriptions including synchronous communication instructions between threads which operate in parallel, and for synthesizing a product circuit based on the received operational descriptions, the high-level synthesis apparatus including: an extractor for analyzing the received operational descriptions and extracting consecutive synchronous communication instructions which are of the same kind from among the received operational descriptions; a scheduler for generating scheduling for each thread by bundling together the extracted synchronous communication instructions into one arithmetic operation; and a circuit generator for generating the product circuit based on results of the scheduling, the product circuit being capable of commencing the bundled synchronous communication instructions with the same level of priority based on handshaking.

In one embodiment of the invention the circuit generator includes: a data path element allocation section for, based on the results of the scheduling, selecting and allocating circuit elements which are necessary for constructing a data path; a handshaking circuit addition section for adding a handshaking circuit for each of input/output ports of the data path; a queuing state generation section for adding a queuing state to the results of the scheduling; and a control circuit generation section for generating a control circuit for performing control based on the results of the scheduling with the queuing state added thereto.

In another aspect of the invention, there is provided a high-level synthesis method for receiving operational descriptions including synchronous communication instructions between threads which operate in parallel, and for synthesizing a product circuit based on the received operational descriptions, the method including the steps of: analyzing the received operational descriptions and extracting consecutive synchronous communication instructions which are of the same kind from among the received operational descriptions; generating scheduling for each thread by bundling together the extracted synchronous communication instructions into one arithmetic operation; and generating the product circuit based on results of the scheduling, the product circuit being capable of commencing the bundled synchronous communication instructions with the same level of priority based on handshaking.

In still another aspect of the invention, there is provided a recording medium carrying a program for implementing the aforementioned high-level synthesis method.

Hereinafter, the effects of the present invention will be described.

According to the present invention, operational descriptions including synchronous communications between threads which operate in parallel are analyzed, and any number of consecutive synchronous communications which are of the same kind are extracted. Then, the scheduling for each thread is generated by bundling together the extracted synchronous communications into one arithmetic operation. Based on such scheduling results, the circuit generated by the method of the present invention can commence the bundled synchronous communications with the same level of priority (e.g., at the same time) during a synchronous communication process via handshaking circuits. As a result, the circuit generated by the method of the present invention is capable of operating at a higher speed than conventional circuits in which such synchronous communication instructions are executed in a consecutive manner.

For example, in the set of operational descriptions illustrated in FIG. 2, the two synchronous communications "SEND (CH1, D1)" and "SEND (CH2, D2)", which are consecutively described and are of the same kind, have no data dependency on each other. Therefore, it is possible to simultaneously commence the two communications and complete the communications within two clock cycles (see the description of the embodiment of the invention with reference to FIG. 13 for more detailed explanation).

As used herein, two instructions are said to have "data dependency" on each other if the two instructions can be illustrated as two nodes that are connected to each other by an arrow in a control data flow graph ("CDFG") (e.g., FIG. 5). The control data flow graph of FIG. 5 corresponds to the operational descriptions shown in FIG. 2. For example, the communication instructions "SEND (CH1, D1)" and "SEND (CH2, D2)" shown in FIG. 2 correspond to the nodes denoted as "CH1W" and "CH2W" of FIG. 5, respectively. Since the nodes CH1W and CH2W are not connected to each other by an arrow, the two communication instructions "SEND (CH1, D1)" and "SEND (CH2, D2)" do not have any 'data dependency' on each other.

Even if two synchronous communication instructions interpose a process which is not a synchronous communication instruction described there between, such two synchronous communication instructions can be bundled together as "consecutive synchronous communication instructions which are of the same kind". However, if two synchronous communication instructions which are of the same kind interpose a different kind of synchronous communication instruction there between (as in a sequence: "RECEIVE(RECV)" —"SEND" —"RECEIVE(RECV)"), the two synchronous communication instructions of the same kind (i.e., RECEIVE(RECV)) cannot be bundled together as "consecutive synchronous communication instructions which are of the same kind".

The circuit generator selects and allocates circuit elements which are necessary for constructing a data path based on the scheduling results, and adds handshaking circuits to respective input/output ports, thereby mapping arithmetic operations associated with synchronous communication into handshaking circuits. Furthermore, by adding a queuing state to the scheduling results and generating a control circuit accordingly, a control circuit can be provided which is capable of controlling communication operations as dictated by the scheduling results.

A recording medium carrying a program for implementing the high-level synthesis method according to the present invention, when read and executed by a computer, can implement a high-level synthesis apparatus which extracts and bundles together any consecutive synchronous communication instructions that are of the same kind, which generates scheduling for each thread, and which generates a circuit that is capable of commencing the execution of the bundled synchronous communication instructions with the same level of priority.

Thus, the invention described herein makes possible the advantages of (1) providing a high-level synthesis apparatus which is capable of synthesizing a circuit which operates at a higher speed than conventional circuits, based on operational descriptions including synchronous communications, and a method for such high-level synthesis: and (2) providing a recording medium carrying a program for implementing such a high-level synthesis method.

These and other advantages of the present invention will become apparent to those skilled in the art upon reading and understanding the following detailed description with reference to the accompanying figures.

BRIEF DESCRIPTION OF THE DRAWINGS

FIG. 13 is a timing chart illustrating a case where synchronous communications within the operational descriptions shown in FIG. 2 are simultaneously processed by a circuit which is obtained according to one embodiment of the present invention.

DESCRIPTION OF THE PREFERRED EMBODIMENTS

Hereinafter, the present invention will be described by way of illustrative examples, with reference to the accompanying figures. Although the below example is mainly directed to the operational descriptions shown in FIG. 2, the operational descriptions for use in the present invention may be described in any high-level language (e.g., Occam, C, or C++) that is capable of expressing the operations of threads which operate in parallel, and expressing the synchronous data communications between such threads, based on instructions, functions, procedures, and/or the like.

Figure 2:
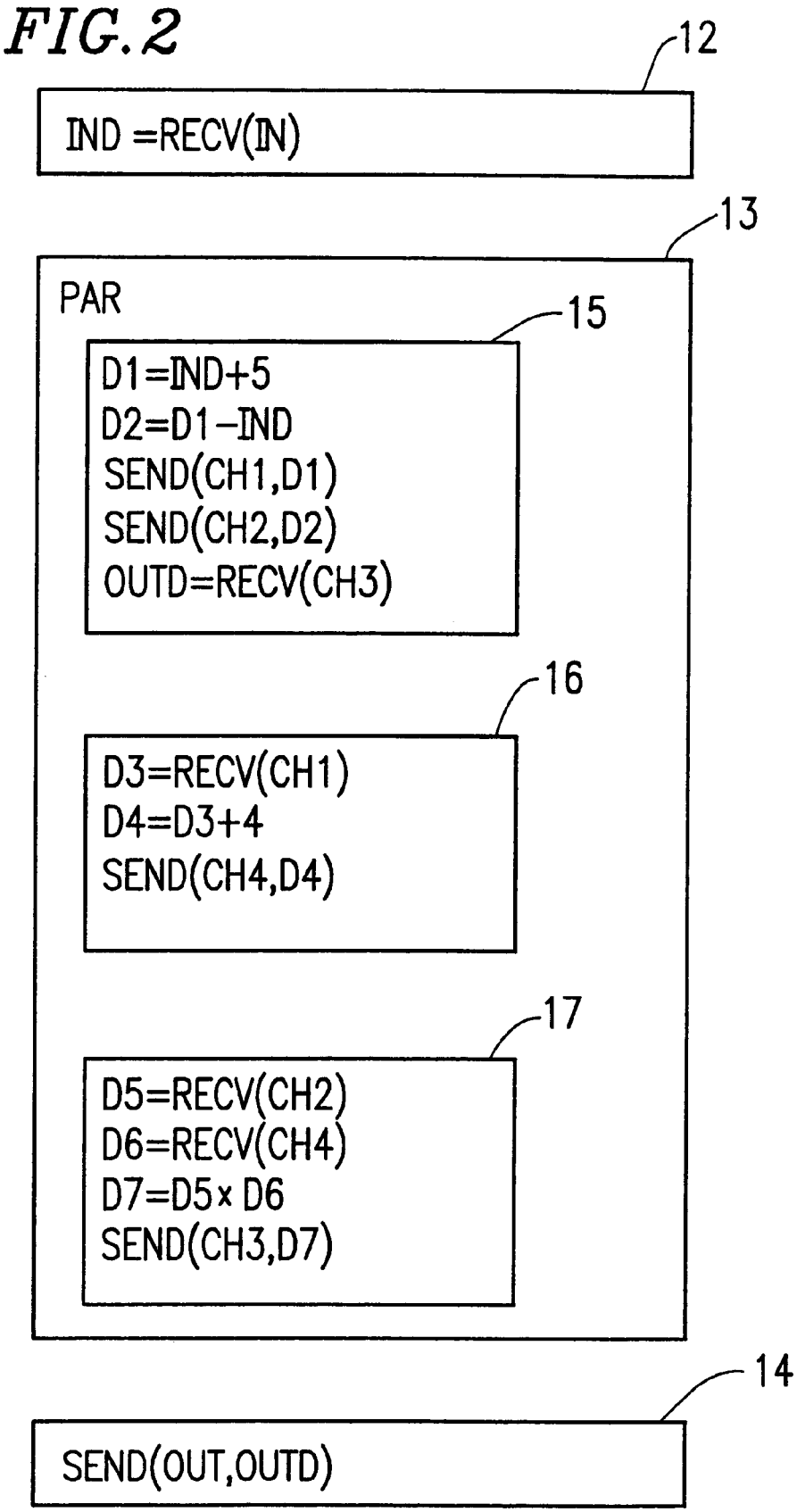
FIG. 2 illustrates an exemplary set of operational descriptions for use in one embodiment of the present invention.
Figure 3:
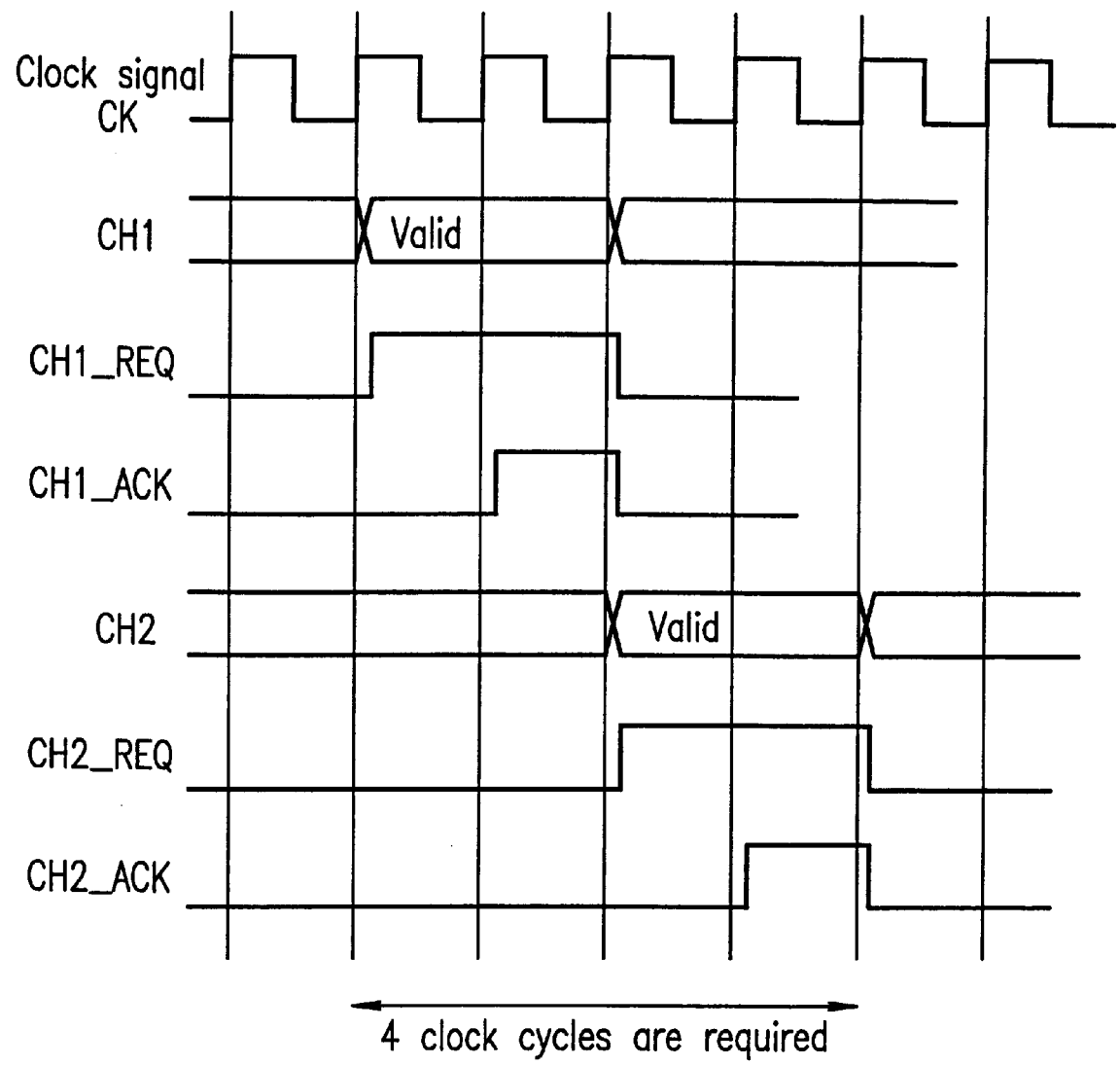
FIG. 3 is a timing chart illustrating a case where synchronous communications within the operational descriptions shown in FIG. 2 are consecutively processed by a circuit which is obtained by a conventional technique.

In the operational descriptions shown in FIG. 2, statements in sections 12, 13, 14 are sequentially executed. The "PAR" syntax used in the section 13 includes a plurality of statements (threads 15, 16, and 17) which are executed in parallel. "SEND" is a statement for sending data through synchronous communication. "RECV" is a statement for receiving data through synchronous communication. Thus, the section 12 in FIG. 2 describes that data be read via a channel (hereinafter denoted with the suffix "CH") expressed as "IN", and stored in a variable "IND". Similarly, the section 14 in FIG. 2 describes that the data of a variable "OUTD" be sent out via a channel "OUT". The sections 15, 16, and 17 of FIG. 2 should also be interpreted similarly.

Figure 4:
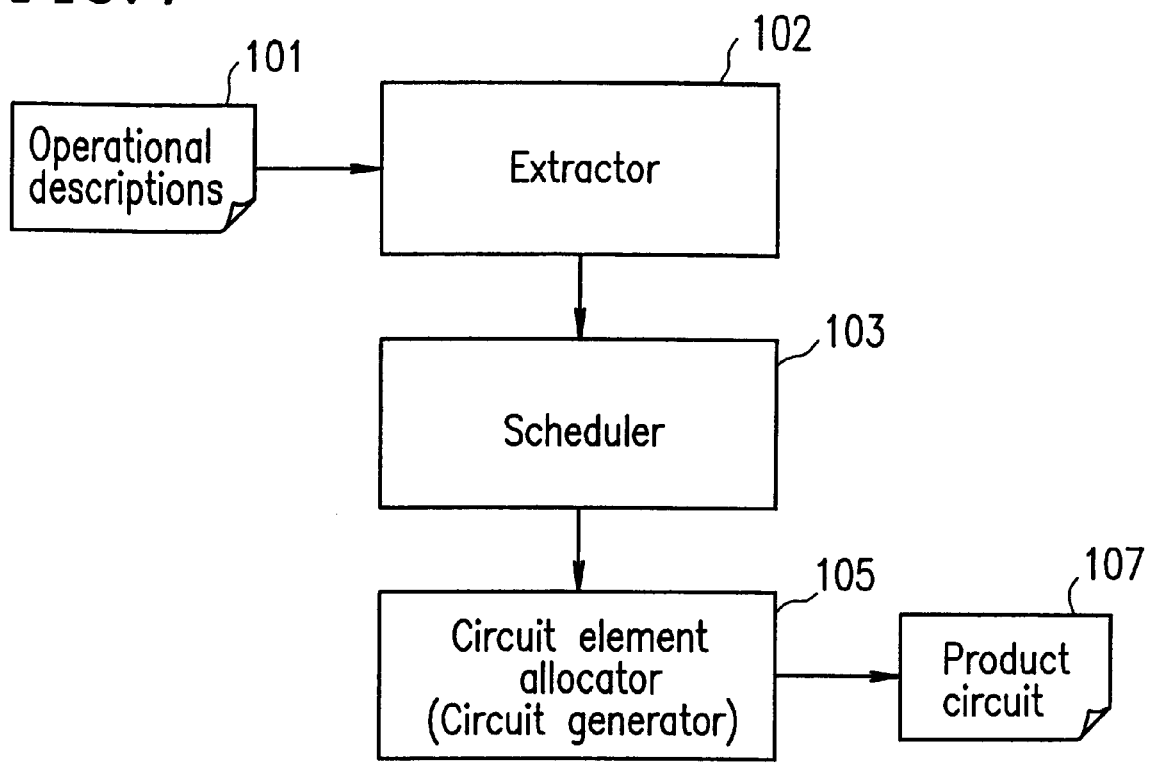
FIG. 4 is a block diagram illustrating the structure of a high-level synthesis apparatus according to one embodiment of the present invention.

FIG. 4 is a block diagram illustrating a high-level synthesis apparatus according to one embodiment of the present invention. This high-level synthesis apparatus includes: an extractor 102 for extracting consecutive synchronous communication instructions which are of the same kind; a scheduler 103 for generating scheduling for each thread; and an element allocator (circuit generator) 105 for allocating circuit elements and generating a product circuit 107. The high-level synthesis apparatus synthesizes the product circuit 107 based on input operational descriptions 101.

The extractor 102 extracts consecutive synchronous communication instructions which are of the same kind, from among the input operational descriptions 101, and converts the input operational descriptions 101 into a control data flow graph (referred to as "CDFG") in which the extracted synchronous communication instructions are bundled together as one node. The CDFG represents control flows for executing the input operational descriptions as well as data flows. In the CDFG, input/output points of data and ramifications of arithmetic operations and control are represented as nodes. Data flows (or dependencies) between nodes and control flows (or dependencies) are denoted as branches. The reason why the input operational descriptions are converted into a CDFG in the high-level synthesis according to the present example is that a CDFG allows for parallel arrangement of hardware while guaranteeing any operations stated in the operational descriptions.

As for the extractor 102 and the processes performed thereby, for example, the technique described in Daniel Gajski et al. "High-Level Synthesis Introduction to Chip and System Design", Kluwer Academic Publishers can be employed.

Examples of synchronous communication instructions include "send" for sending data and "receive" for receiving data. For example, "send" and "send", or "receive" and "receive", are considered as "synchronous communication instructions of the same kind".

Figure 5:
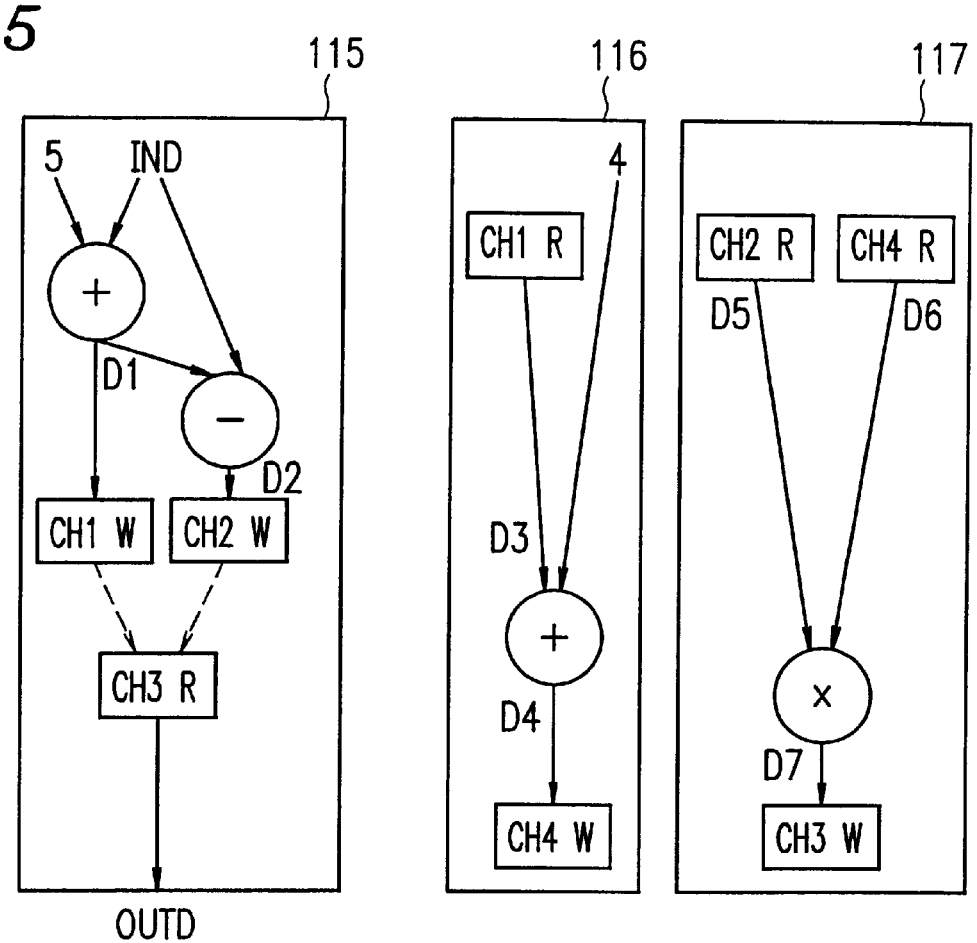
FIG. 5 illustrates an example of a control data flow graph based on the operational descriptions shown in FIG. 2.
Figure 6:
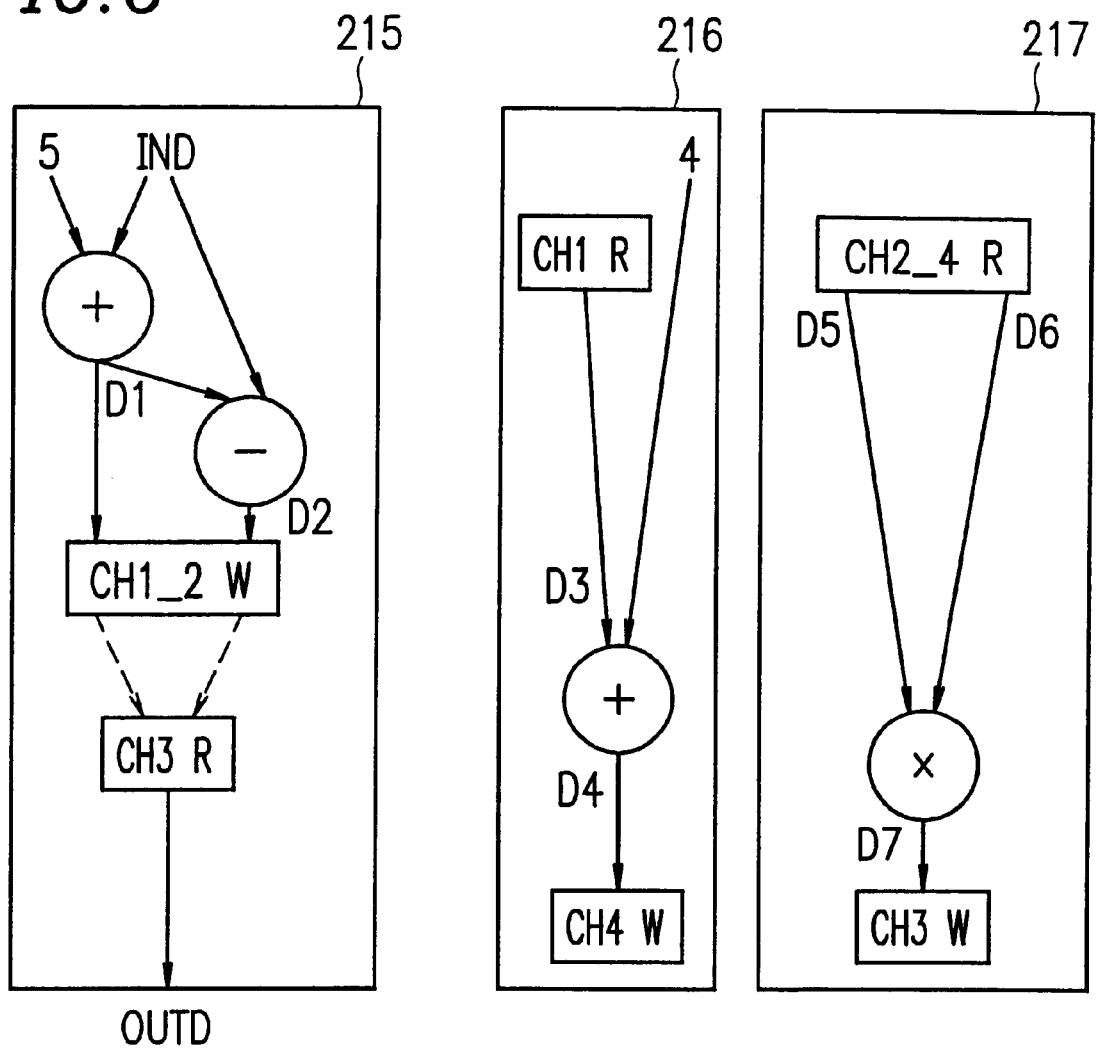
FIG. 6 illustrates an example of a control data flow graph generated by an extractor based on the operational descriptions shown in FIG. 2.

For example, in the operational descriptions shown in FIG. 2, the two "SEND" instructions in the thread 15, or the two "RECEIVE(RECV)" instructions in the thread 17 are considered as consecutive synchronous communication instructions which are of the same kind. The operational descriptions of FIG. 2 can be expressed in the form of a CDFG as shown in FIG. 5. By bundling together the synchronous communication instructions extracted by the extractor 102 into one node, a CDFG shown in FIG. 6 is obtained. Sections 115, 116, and 117 in FIG. 5, and sections 215, 216, and 217 in FIG. 6 correspond to the threads 15, 16, and 17 in FIG. 2, respectively.

Next, the scheduler 103 (FIG. 4) generates scheduling based on the CDFG. That is, based on the interdependencies expressed by the CDFG, the scheduler 103 determines the relative points in time at which data input/output, as well as branching of arithmetic operations and control corresponding to every node, are to be executed.

As for the scheduler 103 and the processes performed thereby, for example, the technique described in Daniel Gajski et al. "High-Level Synthesis Introduction to Chip and System Design", Kluwer Academic Publishers, supra, can be employed.

Figure 7:
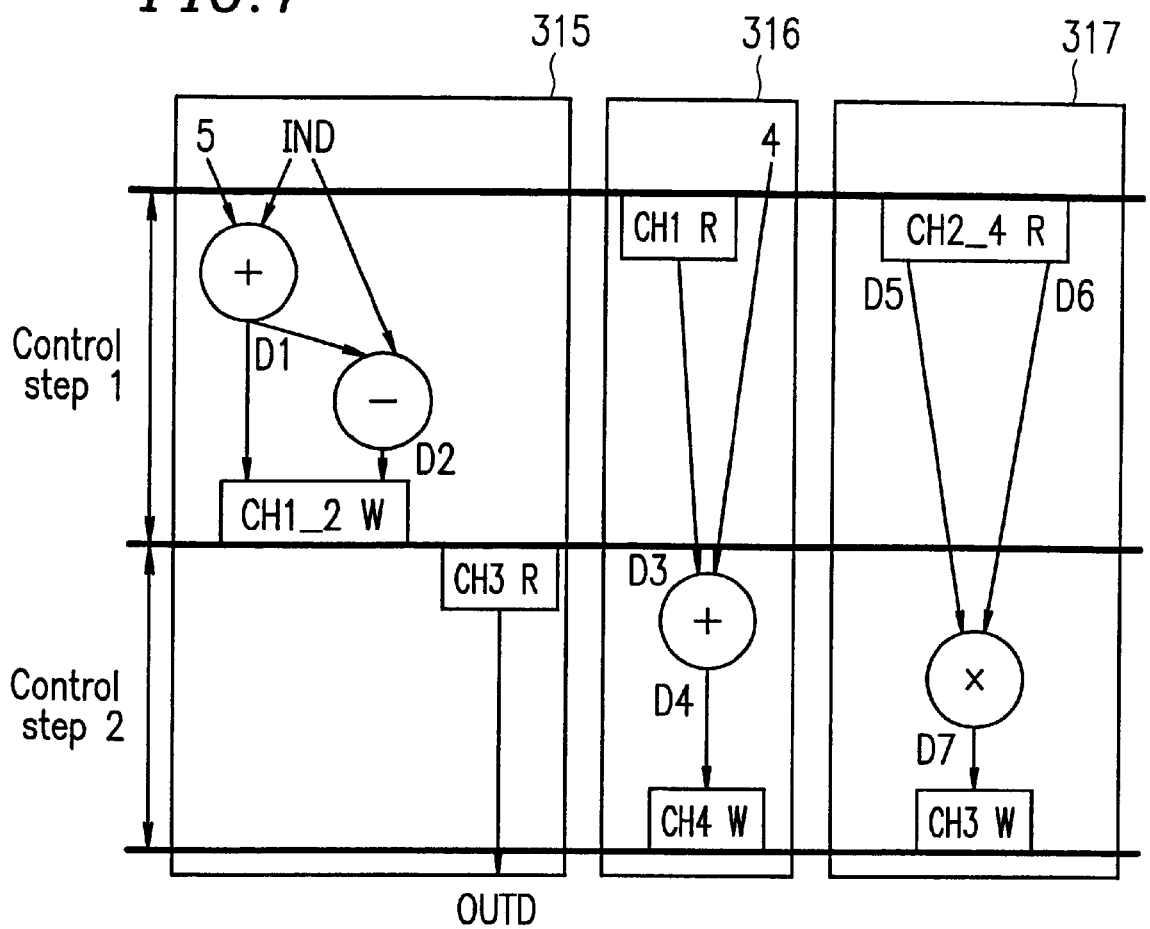
FIG. 7 illustrates an example of a control data flow graph showing scheduling results of the operational descriptions shown in FIG. 2 generated by a scheduler.

FIG. 7 illustrates scheduling results for the threads 15, 16, and 17 (FIG. 2) which are obtained by the scheduler 103. Sections 315, 316 and 317 in FIG. 7 correspond to the threads 15, 16, and 17 in FIG. 2, respectively. The section 315 in FIG. 7 will be described as an example. In a control step 1, a sum of a variable "IND" and "5" is calculated (corresponding to the "+" node), and the sum is substituted in a variable "D1" and is concurrently written to a channel CH1 (corresponding to the "CH1_2W" node). Furthermore, a difference between the variable "D1" and the variable "IND" is calculated (corresponding to the "−" node), and this difference is substituted in a variable "D2" and is concurrently written to a channel CH2 (corresponding to the "CH1_2W" node). Thereafter, in a control step 2, the data is read from a channel CH3 (corresponding to the "CH3R" node) so as to be written to a variable "OUTD". Such a sequence of operations are synthesized so as to occur within one clock cycle. In FIG. 7, the one node "CH1_2W" represents both writing to the channel CH1 and writing to the channel CH2.

Figure 1:
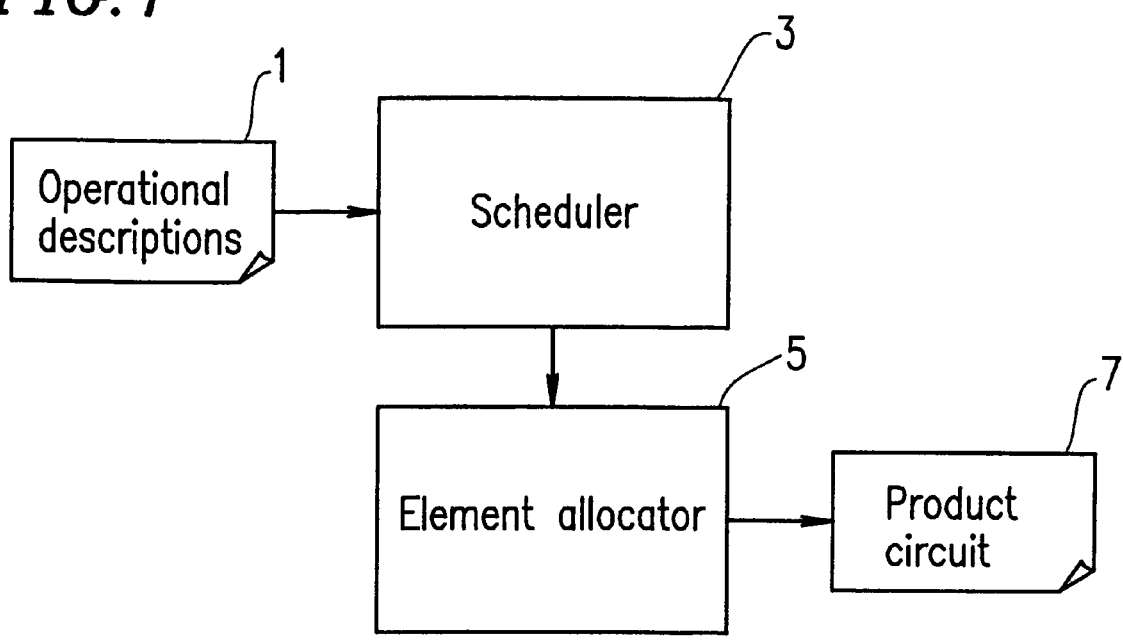
FIG. 1 is a block diagram illustrating the structure of a conventional high-level synthesis apparatus.
Figure 8:
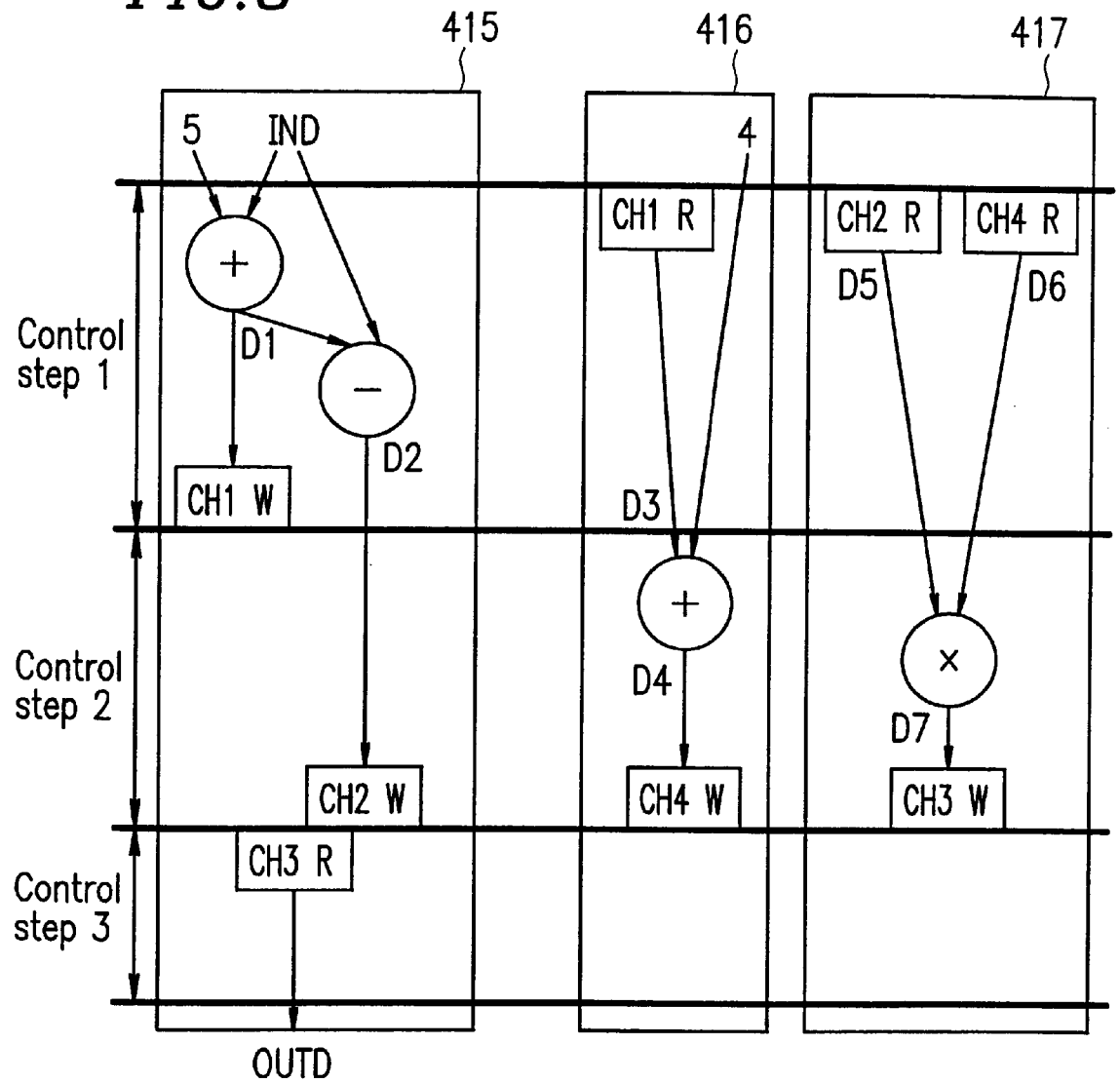
FIG. 8 illustrates an example of a control data flow graph which is generated by a conventional apparatus from the operational descriptions shown in FIG. 2.

For comparison, a CDFG as shown in FIG. 8 will be obtained by subjecting the same operational descriptions to scheduling by the conventional scheduler 3 shown in FIG. 1. Sections 415, 416 and 417 in FIG. 8 correspond to the threads 15, 16, and 17 in FIG. 2, respectively. The section 415 in FIG. 8 will be described as an example. In a control step 1, a sum of a variable "IND" and "5" is calculated (corresponding to the "+" node), and the sum is substituted in a variable "D1" and is concurrently written to a channel CH1 (corresponding to the "CH1W" node). Furthermore, a difference between the variable "D1" and the variable "IND" is calculated (corresponding to the "−" node), and this difference is substituted in a variable "D2". The difference is also written to a channel CH2 (corresponding to the "CH2W" node) in a control step 2. Thereafter, in a control step 3, the data is read from a channel CH3R (corresponding to the "CH3R" node) so as to be written to a variable "OUTD". Thus, there is one more control step being performed in this conventional circuit than in the circuit of the present invention the schedule for which is illustrated in FIG. 7.

Figure 9:
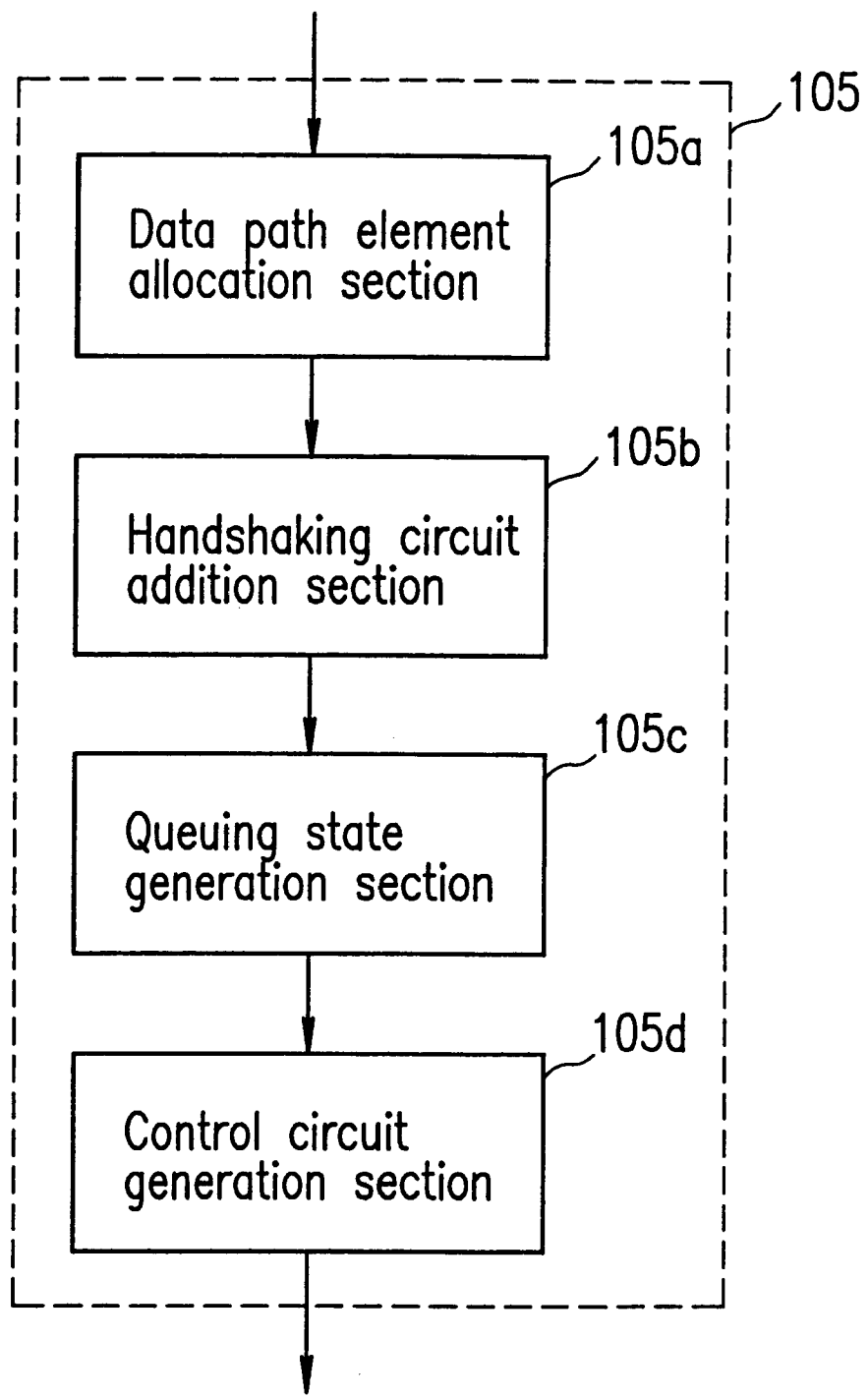
FIG. 9 is a block diagram showing an element allocator in a high-level synthesis apparatus according to one embodiment of the present invention for generating a control circuit by mapping synchronous communication instructions into handshaking circuits.

FIG. 9 shows a detailed structure of the element allocator 105 shown in FIG. 4. The element allocator 105 includes a data path element allocation section 105a, a handshaking circuit addition section 105b, a queuing state generation section 105c, and a control circuit generation section 105d.

Based on the scheduling results by the scheduler 103, the data path element allocation section 105a selects and interconnects circuit elements which are necessary for constructing a data path, e.g., arithmetic logic units to be allocated to the respective arithmetic operations, selectors for data selection, registers for data storage, etc.

As for the data path element allocation section 105a and processes performed thereby, for example, the technique described in Daniel Gajski et al. "High-Level Synthesis Introduction to Chip and System Design", Kluwer Academic Publishers, supra, can be employed.

Figure 10:
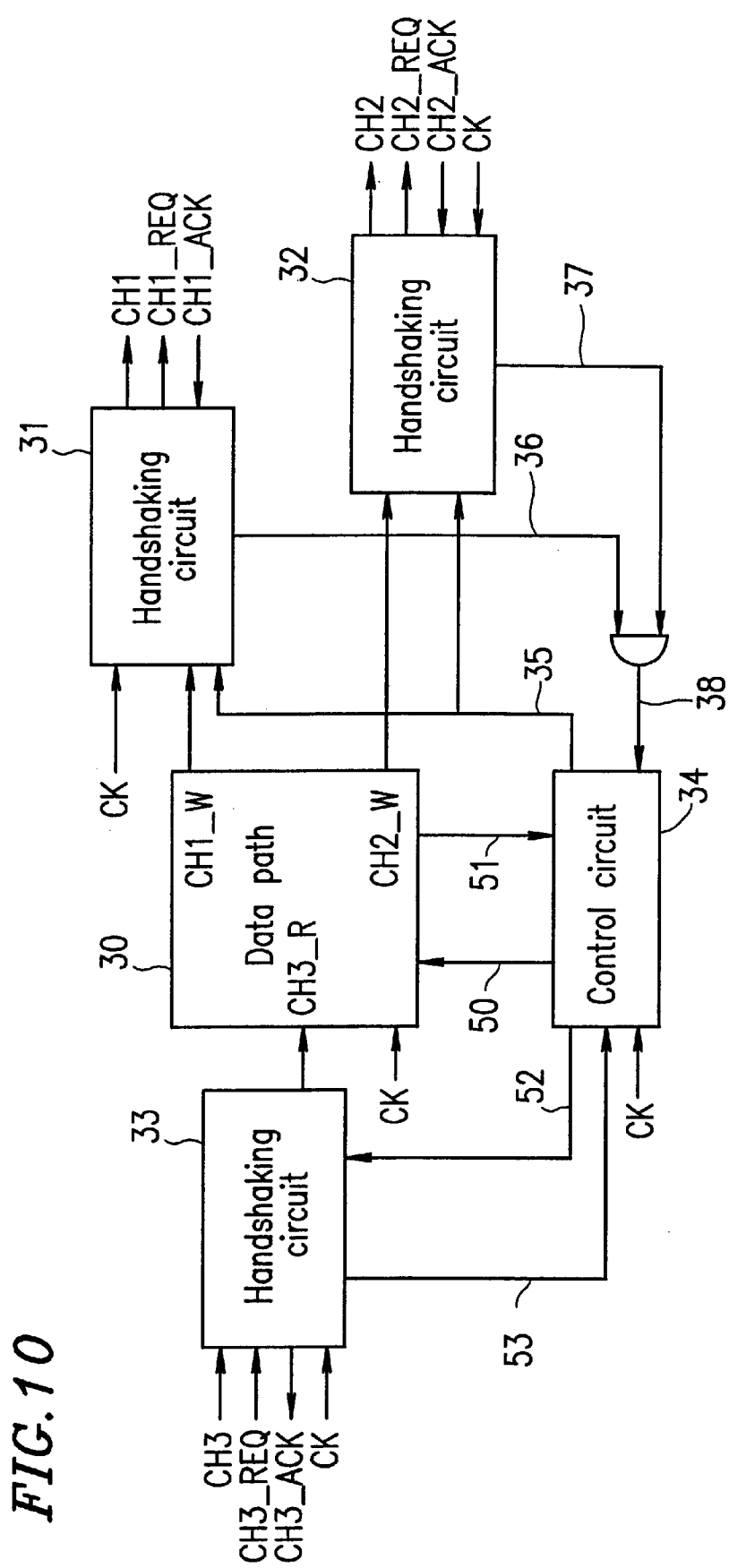
FIG. 10 illustrates the structure of a circuit which is generated from the operational descriptions shown in FIG. 2.

FIG. 10 illustrates a data path 30 generated by the above-described principle of the present invention.

Next, the handshaking circuit addition section 105b adds handshaking circuits 31, 32, and 33 to the respective input/output ports of the data path 30.

The handshaking circuits 31, 32, and 33 are handshaking circuits which are added to the output ports CH1_W, CH2_W, and CH3_R shown in FIG. 5 so as to ensure synchronous communications between threads.

Figure 11:
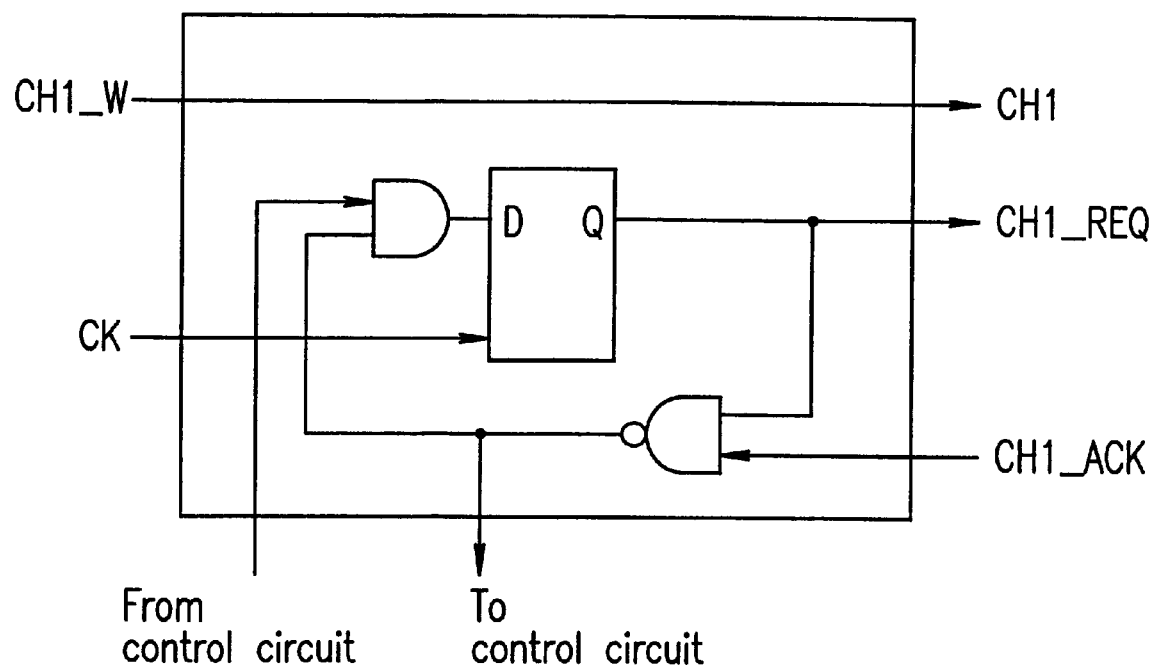
FIG. 11 shows the structure of a handshaking circuit in the high-level synthesis apparatus according to one embodiment of the present invention.

Each one of the handshaking circuits 31, 32, and 33 may have a circuit structure as shown in FIG. 11, for example. For example, the handshaking circuits 31 and 32 in FIG. 10 may commence handshaking communication in synchronization with a clock signal CK as shown in FIG. 13, responsive to a start signal 35 supplied from a control circuit 34.

The handshaking circuits 31 and 32 output end signals 36 and 37 as the hand shaking communication is completed.

CH1, CH2, and CH3 in FIG. 10 denote signal lines for sending the respective data on the channels CH1, CH2, and CH3 in the operational descriptions, respectively. CH1_REQ, CH2_REQ, and CH3_REQ are signal lines which go High during periods in which the respective data on the channels CH1, CH2, and CH3 are valid. The signals on the signal lines CH1_REQ, CH2_REQ, and CH3_REQ are transferred in the same direction as the respective data on the channels CH1, CH2, and CH3. CH1_ACK, CH2_ACK, and CH3_ACK are signal lines which go High as data are received on the channels CH1, CH2, and CH3, respectively. The signals on the signal lines CH1_ACk, CH2_ACk, and CH3_ACk are transferred in the opposite direction to the direction in which the respective data on the CH1, CH2, and CH3 channels are transferred.

A control line 50 in FIG. 10 is used by the control circuit 34, which controls the entire circuitry, for controlling the circuit elements (arithmetic logic units, registers, selectors, etc.) in the data path 30 for executing data calculations. The control circuit 34 determines a next state to occur or signals to be output on the control line 50 based on the current states of the control circuit, circuit elements, and handshaking circuits. A signal line 51 in FIG. 10 is used for sending the states of the respective circuit elements in the data path 30 to the control circuit 34. A control line 52 in FIG. 10 is. used by the control circuit 34 for controlling the circuit elements in the handshaking circuit 33. A signal line 53 in FIG. 10 is used for sending the state of the handshaking circuit 33 to the control circuit 34.

Figure 12:
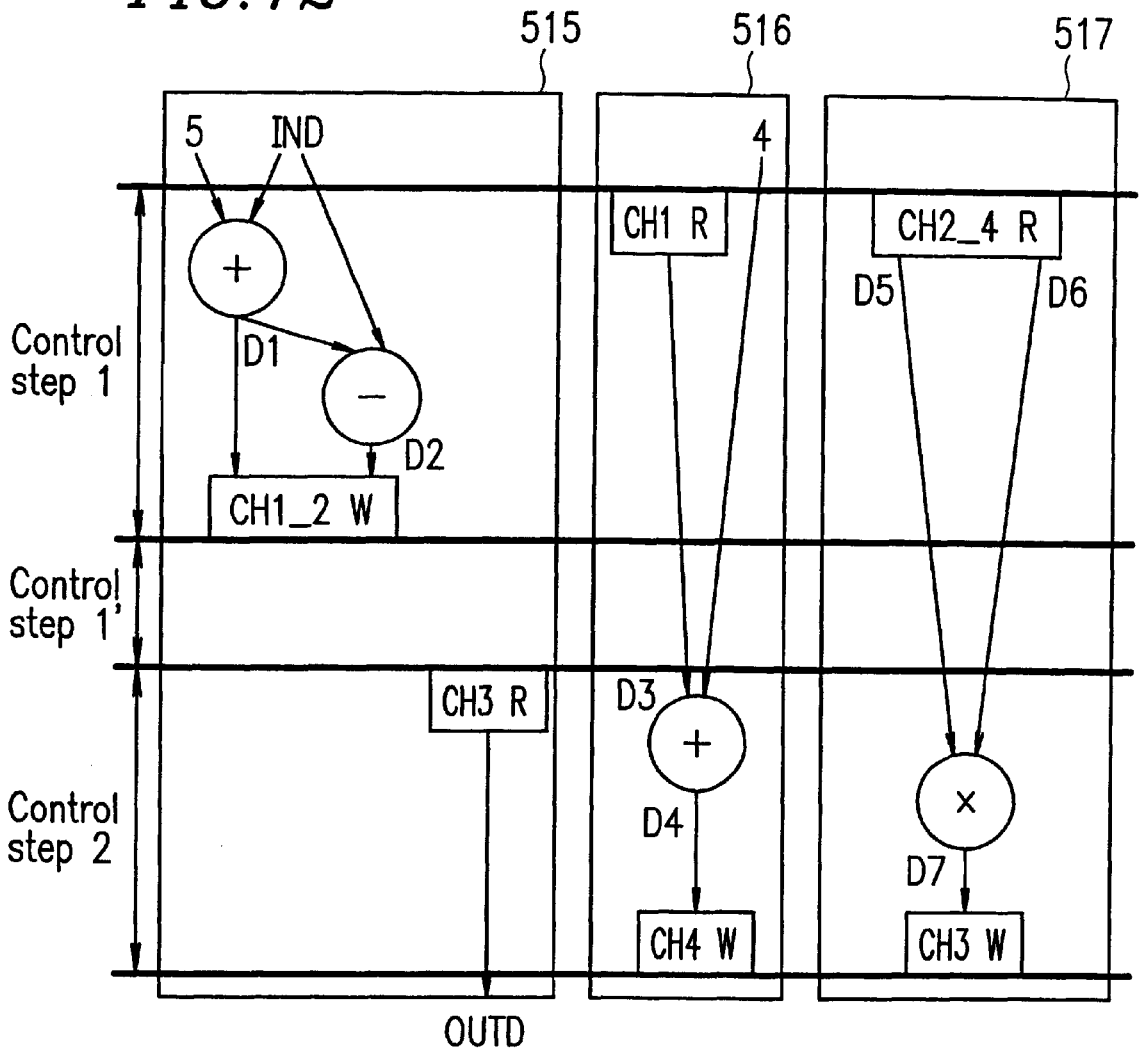
FIG. 12 illustrates an example of a control data flow graph based on the operational descriptions shown in FIG. 2, in which a queuing state is added by a queuing state generation section.

Next, the queuing state generation section 105c adds a new control step for a queuing state, after the control step to which synchronous communications are allocated by the scheduler 103. More specifically, the queuing state generation section 105c adds "1" to the control step of any arithmetic operations that are determined by the scheduler 103 after the inserted queuing state, and stores information in a memory means for indicating a queuing state. For example, in the section 515 shown in FIG. 12, a new control step 1' is generated after the control step 1, to which a node CH1_2W has been allocated.

Finally, the control circuit generation section 105d shown in FIG. 9 generates the control circuit 34 in such a manner that the control circuit 34 is capable of controlling scheduling results with the queuing state added thereto. The illustrated control circuit 34 is arranged so as to repeat the control step 1' shown in FIG. 12 until a completion signal 38 becomes valid to indicate the completion of communications based on bilateral handshaking, as shown in FIG. 10.

As for the control circuit generation section 105d and the processes performed thereby, for example, the technique described in Daniel Gajski et al. "High-Level Synthesis Introduction to Chip and System Design", Kluwer Academic Publishers, supra, can be employed.

The circuit 107 (FIG. 4) which has been generated in the above-described manner can commence the two "SEND" instructions within the section 15 (FIG. 2) with the same priority level based on handshaking, and therefore is capable of executing the two "SEND" instructions within two clock cycles as shown in FIG. 13. Similarly, it is possible to generate a circuit which can commence the two "RECV" instructions within the section 17 (FIG. 2) with the same priority level based on handshaking, and therefore is capable of executing the two "RECV" instructions within two clock cycles. Similarly, three or more synchronous communication instructions may be commenced with the same priority level based on handshaking, thereby increasing the operation speed.

As described above, according to the present invention, a circuit which is capable of commencing the execution of a plurality of synchronous communication instructions with the same priority level based on handshaking can be generated from operational descriptions including synchronous communication instructions between threads. As a result, i n the designing of logical circuits in an LSI, a circuit can be realized which has a higher operation speed and higher processing performance than in the conventional techniques of consecutively executing a plurality of synchronous communication instructions.

Furthermore, by loading onto a computer a high-level synthesis program which is carried on the recording medium according to the present invention, a high-level synthesis apparatus can be realized. Therefore, the high-level synthesis method according to the present invention can be broadly applied to the designing of logical circuits in LSIs and subsequent LSI manufacturing steps.

What is claimed is:

1. A high-level synthesis apparatus for receiving operational descriptions including synchronous communication instructions between threads which operate in parallel, and for synthesizing a product circuit based on the received operational descriptions, the high-level synthesis apparatus comprising:

an extractor for analyzing the received operational descriptions, extracting consecutive synchronous communication instructions which are of the same kind from among the received operational descriptions, and bundling the extracted synchronous communication instructions of the same kind together;

a scheduler for generating scheduling for each thread by scheduling the bundled extracted synchronous communication instructions of the same kind as one arithmetic operation; and a circuit generator for generating the product circuit based on results of the scheduling, the product circuit being capable of commencing the bundled synchronous communication instructions with the same level of priority based on handshaking.

2. A high-level synthesis apparatus according to claim 1, wherein the circuit generator comprises:

a data path element allocation section for, based on the results of the scheduling, selecting and allocating circuit elements which are necessary for constructing a data path;

a handshaking circuit addition section for adding a handshaking circuit for each of input/output ports of the data path;

a queuing state generation section for adding a queuing state to the results of the scheduling: and a control circuit generation section for generating a control circuit for performing control based on the results of the scheduling with the queuing state added thereto.

3. A high-level synthesis method for receiving operational descriptions including synchronous communication instructions between threads which operate in parallel, and for synthesizing a product circuit based on the received operational descriptions, the method comprising the steps of:

analyzing the received operational descriptions, extracting consecutive synchronous communication instructions which are of the same kind from among the received operational descriptions, and bundling the extracted synchronous communication instructions of the same kind together;

generating scheduling for each thread by scheduling the bundled extracted synchronous communication instructions of the same kind as one arithmetic operation; and generating the product circuit based on results of the scheduling, the product circuit being capable of commencing the bundled synchronous communication instructions with the same level of priority based on handshaking.

4. A recording medium carrying a program for implementing the high-level synthesis method according to claim 3.

* * * * *